(12) United States Patent
Liao et al.

(10) Patent No.: US 9,130,129 B2
(45) Date of Patent: Sep. 8, 2015

(54) LIGHT-EMITTING DIODE CHIP

(71) Applicant: FORMOSA EPITAXY INCORPORATION, Taoyuan County (TW)

(72) Inventors: Han-Zhong Liao, Taoyuan County (TW); Chih-Hsuan Lu, Taoyuan County (TW); Fang-I Li, Taoyuan County (TW); Wei-Kang Cheng, Taoyuan County (TW); Shyi-Ming Pan, Taoyuan County (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 163 days.

(21) Appl. No.: 13/715,120

(22) Filed: Dec. 14, 2012

(65) Prior Publication Data

US 2013/0175572 A1      Jul. 11, 2013

(30) Foreign Application Priority Data

Jan. 11, 2012   (TW) ............................. 101101147 A

(51) Int. Cl.
*H01L 33/42* (2010.01)
*H01L 33/20* (2010.01)
*H01L 33/38* (2010.01)

(52) U.S. Cl.
CPC ................ *H01L 33/42* (2013.01); *H01L 33/20* (2013.01); *H01L 33/38* (2013.01)

(58) Field of Classification Search
CPC .......... H01L 33/38; H01L 33/20; H01L 33/42
USPC ........................................................... 257/99
See application file for complete search history.

(56) References Cited

U.S. PATENT DOCUMENTS

2005/0254243 A1*  11/2005  Jiang et al. ..................... 362/249
2010/0127274 A1*  5/2010   Yoo .................................. 257/76

* cited by examiner

*Primary Examiner* — William F Kraig
*Assistant Examiner* — Nga Doan
(74) *Attorney, Agent, or Firm* — Rosenberg, Klein & Lee

(57) ABSTRACT

A light-emitting diode (LED) chip comprising a first semiconductor layer; an active layer disposed on said first semiconductor layer; a second semiconductor layer disposed on said active layer; metal layers which disposed on said second semiconductor layer and overlapped with each other indirectly, comprising a first metal layer which connected to a first electrode deposited on said first semiconductor, and a second metal layer which connected to a transparent conductive layer and a second electrode deposited on said second semiconductor layer; wherein said second metal layer deposited on said first metal layer which further connected to said first semiconductor layer through an indentation.

7 Claims, 8 Drawing Sheets

LIGHT-EMITTING DIODE CHIP

BACKGROUND OF THE INVENTION

1. Fields of the Invention

The present invention relates to a light-emitting diode (LED) chip, especially to an LED chip comprising indirectly overlapped metal layers which are branched and distributed over a surface of the LED chip.

2. Descriptions of Related Art

A light-emitting diode (LED) is a light source made from semiconductor materials such as III-V group of semiconductors including gallium phosphide, gallium arsenide, etc. When a voltage is applied to the semiconductor, electrons and holes meet and recombine under electrode voltage difference. At this moment, the electrons fall to the lower energy level and the energy is released in the form of photons. The electric power is converted to light that is emitted out.

Due to exhaustion of non-renewable resources including coal, natural gas, petroleum, etc, energy saving products also need development besides developing new energy sources to slow down consumption of fossil fuels. Under the pressure of unstable oil prices, countries worldwide are dedicated to develop energy saving products. Thus technologies of light-emitting diode, a so-called green light source, become more mature over time, and the application fields thereof get broader. Right now LED's have been widely used in indicators and display of computer, communication and consumer electronics (3C) products. Along with increasing yield rate of LED's, manufacturing cost per each unit of LED is significantly reduced, prompting adoption of LED as lighting material in various fields.

As mentioned above, since development of high brightness LED has been a research emphasis of manufacturers in most countries, how to further enhance the efficiency of the LED shall be the focus to be stressed for improvement.

SUMMARY OF THE INVENTION

Refer to FIG. 1, a lateral light-emitting diode chip basically comprises a substrate 10, a first semiconductor layer 11, an active layer 12, a second semiconductor layer 13, a first electrode 40 and a second electrode 41. As shown in the figure, the first semiconductor layer 11 which is an n-type semiconductor is disposed on the substrate 10, and the active layer 12 is disposed on the first semiconductor layer 11. Then the second semiconductor layer 13 which is a p-type semiconductor is disposed on the active layer 12. The first electrode 40 and the second electrode 41 are respectively disposed on the first semiconductor layer 11 and the second semiconductor layer 13. While in use, an external voltage is applied to the light-emitting diode chip through the electrodes to make the active layer 12 emit light. Because the current tends to traverse the shortest pathway, the current flows downward vertically from the second electrode 41 through the second semiconductor layer 13 and then arrives the active layer 12. Such that the main emission area of the active layer 12 is restricted to a region just below the second electrode 41 and the neighborhood. As to the area farther, the emission efficiency thereof is lowered due to less current passed.

One of the embodiments of the present invention is to provide a light-emitting diode (LED) chip comprising metal layers which are branched into several strips and distributed over a surface of the LED chip. Thus there is needless to reduce the area of a semiconductor layer and an active layer greatly for exposing a first electrode deposited on a first semiconductor layer. The ratio of the area of the active layer to that of the LED chip is increased and emission area is thereby increased.

Another one of the embodiments of the present invention is to provide an LED chip comprising a plurality of indentations penetrating a second semiconductor layer and the active layer to reach a first semiconductor layer. Thus metal layers can electrically connect to the first semiconductor layer, and the flowing path of electric current is not limited to a single position but distributed over the LED chip through the metal layers evenly.

DETAILED DESCRIPTION OF THE PREFERRED EMBODIMENT

Figure 1:
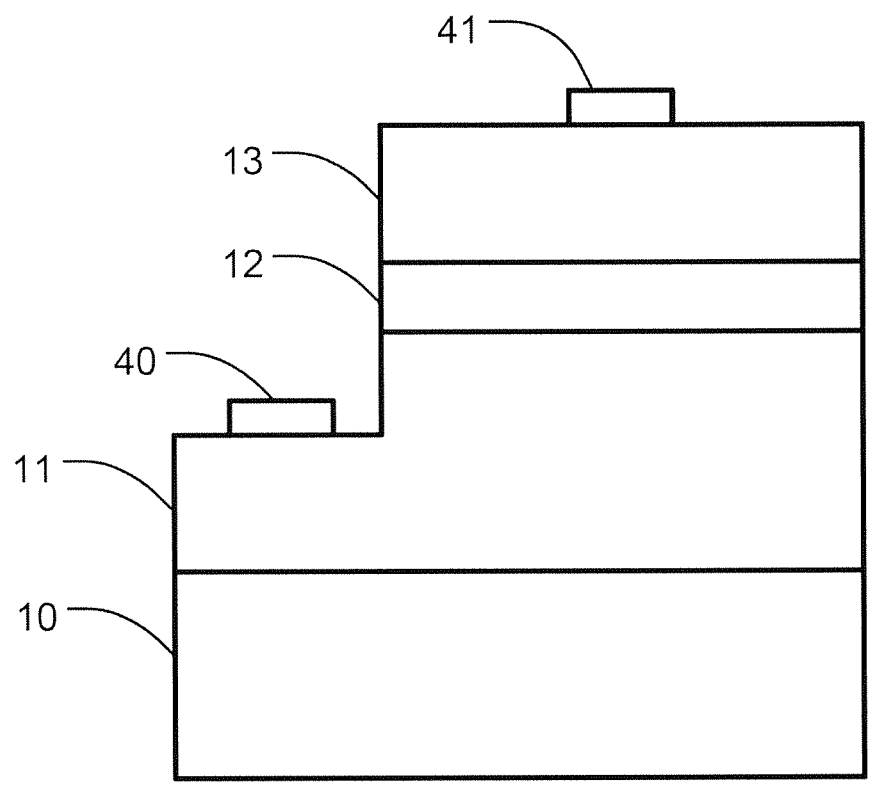
FIG. 1 is a schematic drawing showing structure of an LED chip.
Figure 2:
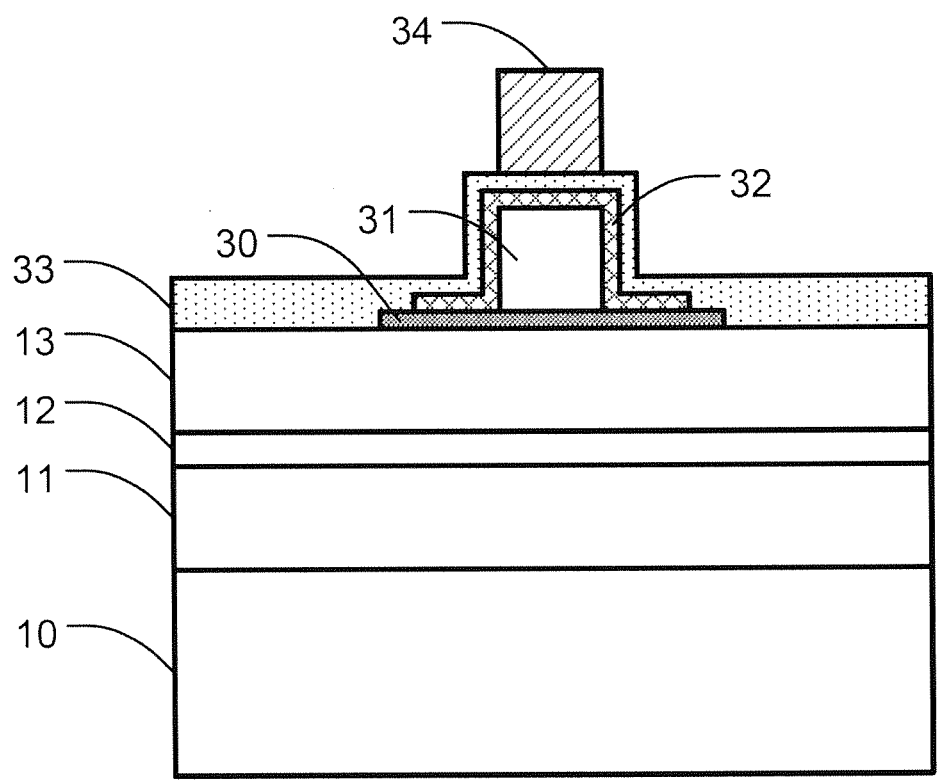
FIG. 2 is a schematic drawing showing a cross section of the embodiment according to the present invention.
Figure 3:
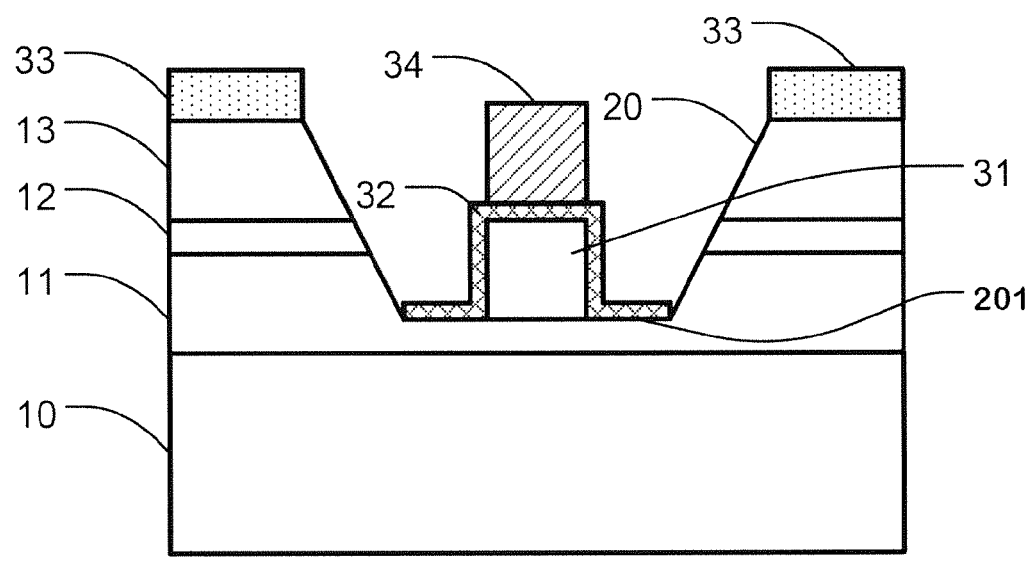
FIG. 3 is a schematic drawing showing a cross section of the embodiment comprising an indentation according to the present invention.

An embodiment according to the present invention, as shown in FIG. 2 and FIG. 3, is an LED chip comprising a substrate 10, a first semiconductor layer 11 deposited on the substrate 10, an active layer 12 deposited on the portion of the semiconductor layer 11, a second semiconductor layer 13 deposited on the active layer 12, at least one indentation 20 (Another embodiment comprises a plurality of indentation 20) comprising a bottom part 201 deposited on the second semiconductor layer 13; a first insulating layer 30, a first metal layer 31, a second insulating layer 32, a transparent conductive layer 33, and a second metal layer 34 deposited on the second semiconductor layer 13 sequentially. Wherein the bottom part 201 of indentation 20 extends downward to reach the first semiconductor layer 11.

Further, the first insulating layer 30 is disposed on a portion of the second semiconductor layer 13 to separated the first metal layer 31 and the second semiconductor layer 13 as shown in FIG. 2. At the position of the indentation 20 as shown in FIG. 3, the first semiconductor layer 11 is exposed at the bottom part 201, the first metal layer 31 is disposed on the first insulating layer 30 at the bottom part 201 of the indentation 20, so that the first metal layer 31 can electrically connects to the first semiconductor layer 11. The second insulating layer 32 covers at least a portion of the first metal layer 31. The transparent conductive layer 33 is disposed on the second semiconductor layer 13 and the second insulating layer 32, and the second metal layer 34 is disposed on the second transparent conductive layer 33 and the second insulating layer 32.

According to the structure of the present invention described forward, while the first metal layer 31 is disposed on the second semiconductor layer 13, the first metal layer 31 is isolated by the first insulating layer 30 and the second insulating layer 32. And while the first metal layer 31 proceeds to the bottom part 201 of the indentation 20, the first metal layer 31 connects to the first semiconductor layer 11 smoothly because the first insulating layer 30 does not extend to the bottom part 201, thereby achieving the goal of current spreading.

Figure 4:
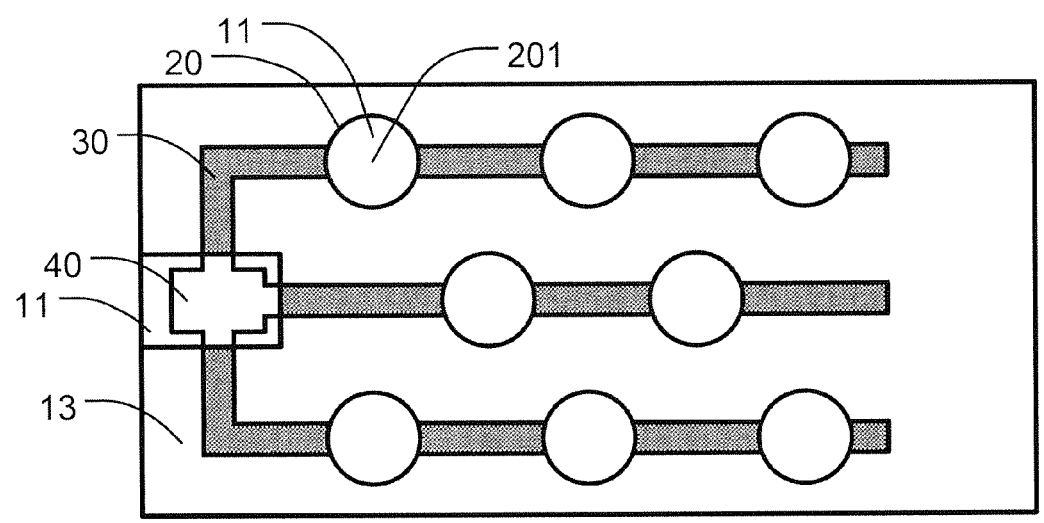
FIG. 4 is a schematic drawing showing a top view of the embodiment without the transparent conductive layer according to the present invention.

FIG. 4 is a schematic drawing showing a top view of the embodiment of the present invention without the transparent conductive layer 33 and the second metal layer 34. As shown in the figure, the LED chip of the present invention further comprises a first electrode 40 which connected to the first metal layer 31 deposited on the first semiconductor layer 11, and a plurality of the indentations 20 are distributed over the surface of the LED chip wherein the bottom part 201 of each indentation exposes the first semiconductor layer 11 which originally covered by the active layer 12 and the second semiconductor layer 13. The LED chip further comprises a branched-strip metal cover region which distributed like fingers is disposed on the second semiconductor layer 13, where the first insulating layer 30 is disposed thereon and along edges of the indentations 20 without passing through the bottom parts 201. So that the first metal layer 31 deposited on the insulating layer 30 will not contact the active layer 12 or the second semiconductor layer 13 resulting in short circuit. In other words, under electrical isolation from the second semiconductor layer 13 by the first insulating layer 30, the first metal layer 31 deposited on the first insulating layer 30 can still connects to the first semiconductor layer 11 at the bottom parts 201 of the indentations 20.

Figure 5:
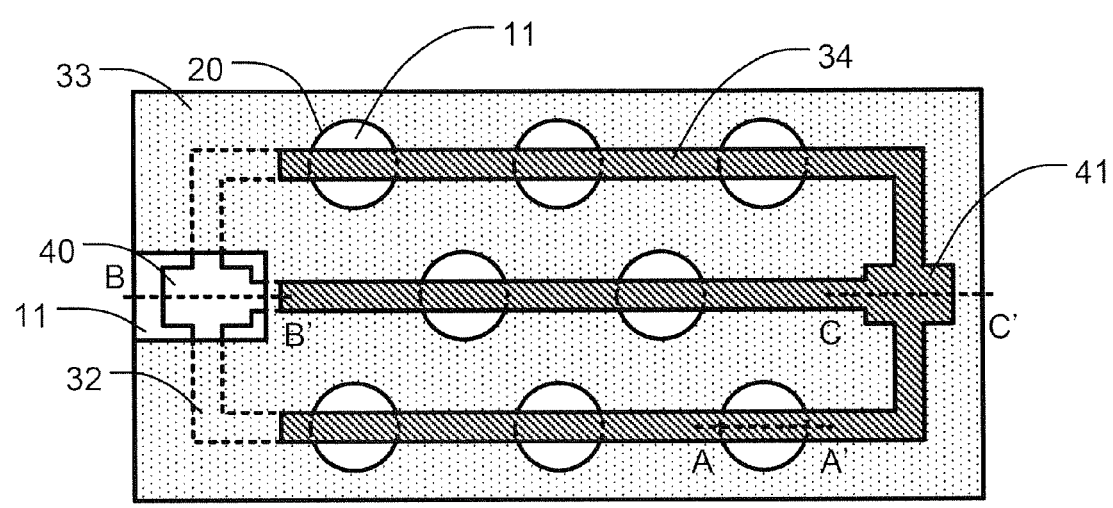
FIG. 5 is a schematic drawing showing a top view of the embodiment according to the present invention.

FIG. 5 is a schematic drawing showing a top view of the embodiment of the present invention as illustrated in FIG. 4 further deposited the transparent conductive layer 33, the second metal layer 34, and the second electrode 41. As shown in the figure, the LED chip of the present invention further comprises a second electrode 41 which connected to the second metal layer 34 deposited on the transparent conductive layer 33 which completely covered the second semiconductor layer 13, and the second insulating layer 32 deposited between the first metal layer 31 and the second metal layer 34. Wherein the transparent conductive layer 33 further covered the second insulating layer 32, the first metal layer 31, and the first insulating layer 30.

Regarding to material of the structure of the embodiment described forward, when the first semiconductor layer 11 is an n-type semiconductor layer, the second semiconductor layer 13 is a p-type semiconductor layer. And accordingly, the first electrode 40 is an n-type electrode and the second electrode 41 is a p-type electrode. On the other hand, when the first semiconductor layer 11 is a p-type semiconductor layer, the second semiconductor layer 13 is an n-type semiconductor layer; and the first electrode 40 is a p-type electrode, the second electrode 41 is an n-type electrode. And the transparent conductive layer 33 comprises indium tin oxide that is a mixture of indium oxide ($In_2O_3$) and tin oxide ($SnO_2$). Generally, the mass ratio of the mixture is 90% $In_2O_3$ and 10% $SnO_2$. When indium tin oxide is in a film form, it is transparent and conductive. Thus, light emitted from the active layer 12 can pass the transparent conductive layer 33 smoothly. Moreover, due to conductivity of the transparent conductive layer 33, current generated by the voltage applied to the second metal layer 34 can flow to the second semiconductor layer 13 through conduction of the transparent conductive layer 33.

In order to disclose the structure of the LED chip of the present invention in more detail, the cross sections at line A-A', B-B', and C-C' of FIG. 5 are illustrated as backward.

Figure 6:
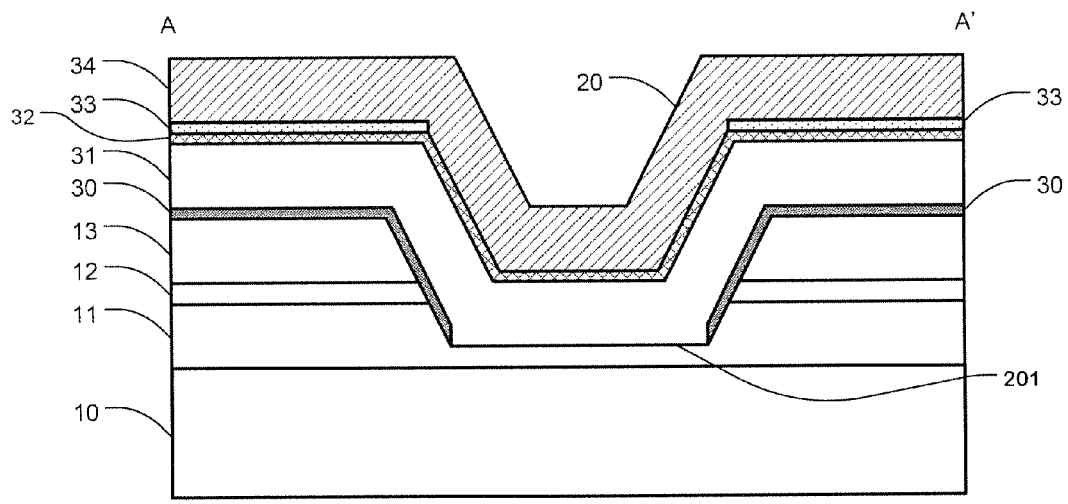
FIG. 6 is a schematic drawing showing a cross section of line A-A' of FIG. 5 according to the present invention.

As shown in FIG. 6, the cross section at the line A-A' of FIG. 5 illustrated the structure of indentation 20 of the LED chip of the present invention, the first metal layer 31 connects to the first semiconductor layer 11 at the bottom part 201. The first insulating layer 30 effectively isolates the first metal layer 31 from the second semiconductor layer 13 or the active layer 12, so that the LED chip can operate normally under the structure comprising indentations.

As shown in FIG. 4 to FIG. 6, the LED chip of the present invention comprises the first metal layer 31 and the second metal layer 34 which are arranged into an indirect overlapping structure and electrically isolated with each other by the second insulating layer 32. And the metal layers with the indirect overlapping structure are branched into several strips like fingers and distributed on the surface of the LED chip, then the electric current can be distributed and flows more evenly, which increasing not only the emission area of the active layer 12 but also the emission efficiency. In order to achieve the indirect overlapping, the shape and volume of the overlapped portions of the first metal layer 31 and the second metal layer 34 are the same, and the first metal layer 31 and the second metal layer 34 comprise metal compound. In order to decrease and avoid any possible shielding on the active layer 12 caused by stacking of the metal layers there above, the first metal layer 31 and the second metal layer 34 are overlapped mostly and precisely from the top view of the LED chip of the present invention to ensure the light extraction efficiency.

Figure 7:
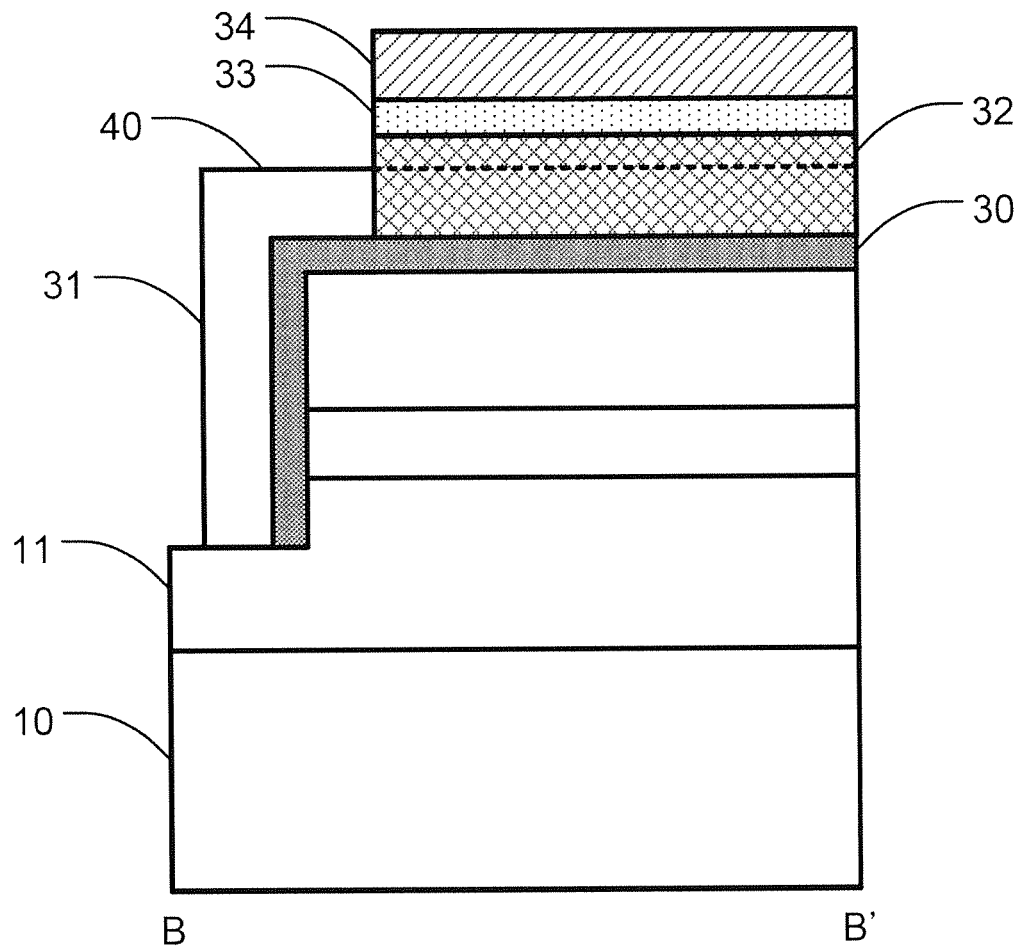
FIG. 7 is a schematic drawing showing a cross section of line B-B' of FIG. 5 according to the present invention.

As shown in FIG. 7, the cross section at the line B-B' of FIG. 5 illustrated the structure at the position of the first electrode 40 of the LED chip of the present invention, the first electrode 40 disposed on the first semiconductor layer 11 is located on one side of the LED chip, and connects to the first metal layer 31 along the first insulating layer 30 which separated/isolated the electrode 40 and the first metal layer 31 from the second semiconductor layer 13 and the active layer 12 to prevent short circuit.

Figure 8:
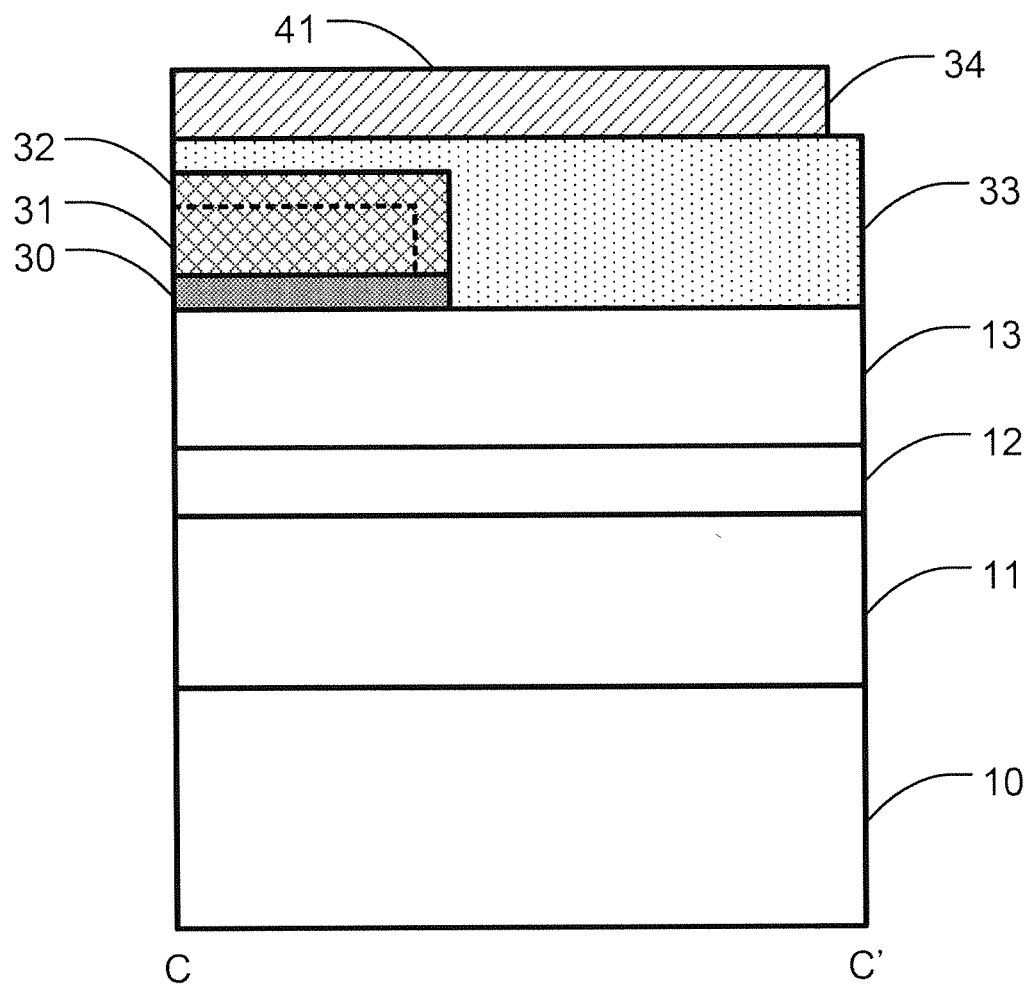
FIG. 8 is a schematic drawing showing a cross section of line C-C' of FIG. 5 according to the present invention.

As shown in FIG. 8, the cross section at the line C-C' of FIG. 5 illustrated the structure at the position of the second electrode 41 of the LED chip of the present invention, the second electrode 41 disposed on the transparent conductive layer 33 is located on the other side of the LED chip, and connects to the second metal layer 34. The first electrode 40 and the second electrode 41 are positioning for wire bonding of the LED chip with adjacent LED chips or a power source. By bonding wires made of gold, a voltage can be applied to the LED chip of the present invention to emit light.

According to the present invention as illustrated forward, the first metal layer 31 electrically connects to the first semiconductor layer 11 at the bottom part 201 of each indentation 20. Then the current can flow along a path formed by the second metal layer 34, the transparent conductive layer 33, the second semiconductor layer 13, the active layer 12, the first semiconductor layer 11, and the first metal layer 31, so as to make the active layer 12 emit light evenly and enhancing the light emission efficiency. Because the voltage applied is distributed evenly by the branched-strip design, the region far away from the center of the LED can still get the same voltage supply through the branched-strip distribution of the overlapped metal layers. And there is needless to reduce the area of the active layer 12 and the second semiconductor layer 13 greatly for exposing the electrode on the first semiconductor layer 11. Therefore the present invention increases a ratio of the area of the active layer 12 to that of the overall chip, the light extraction area the light extraction efficiency.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A light-emitting diode (LED) chip comprising:
   a first semiconductor layer;
   an active layer disposed on said first semiconductor layer;
   a second semiconductor layer disposed on said active layer;
   at least one indentation disposed on said second semiconductor layer, said indentation comprising a bottom part extending downward to reach said first semiconductor layer and exposing said first semiconductor layer; and
   a plurality of metal layers which disposed on said second semiconductor layer, comprising a first metal layer which is connected to said first semiconductor layer through said bottom part, and a second metal layer which is connected to a transparent conductive layer deposited on said second semiconductor layer;
   wherein said second metal layer indirectly deposited on said first metal layer.

2. The LED chip as claimed in claim 1, further comprising:
   a first electrode deposited on said first semiconductor layer and connected to said first metal layer; and
   a second electrode deposited on said second semiconductor layer and connected to said second metal layer.

3. The LED chip as claimed in claim 1 further comprising a first insulating layer deposited between said first metal layer and said second semiconductor layer, and between said active layer and said first metal layer, and connected to said plurality of indentations, for isolating said first metal layer from said second semiconductor layer and said active layer.

4. The LED chip as claimed in claim 1, wherein said metal layers branched into several strips and distributed over a surface of the LED chip.

5. The LED chip as claimed in claim 1, wherein shapes and volumes of the overlapped portions of said metal layers are the same.

6. The LED chip as claimed in claim 1, wherein the material of said transparent conductive layer comprises a mixture of indium oxide and tin oxide, and the mass ratio of the mixture is 90% the indium oxide and 10% the tin oxide.

7. The LED chip as claimed in claim 1, further comprising a second insulating layer deposited between said first metal layer and said second metal layer to isolate said second metal layer from said first metal layer.

* * * * *